US012024794B2

United States Patent
Leonard et al.

(10) Patent No.: US 12,024,794 B2
(45) Date of Patent: Jul. 2, 2024

(54) REDUCED OPTICAL ABSORPTION FOR SILICON CARBIDE CRYSTALLINE MATERIALS

(71) Applicant: Wolfspeed, Inc., Durham, NC (US)

(72) Inventors: Robert Tyler Leonard, Raleigh, NC (US); Elif Balkas, Cary, NC (US); Valeri F. Tsvetkov, Durham, NC (US); Yuri Khlebnikov, Raleigh, NC (US); Kathryn A. O'Hara, Raleigh, NC (US); Simon Bubel, Carrboro, NC (US); David P. Malta, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 187 days.

(21) Appl. No.: 17/350,100

(22) Filed: Jun. 17, 2021

(65) Prior Publication Data

US 2022/0403552 A1 Dec. 22, 2022

(51) Int. Cl.
*C30B 33/02* (2006.01)
*H01L 33/34* (2010.01)

(52) U.S. Cl.
CPC .............. *C30B 33/02* (2013.01); *H01L 33/34* (2013.01)

(58) Field of Classification Search
None
See application file for complete search history.

(56) References Cited

U.S. PATENT DOCUMENTS

| 5,718,760 | A | 2/1998 | Carter et al. |
| 6,045,613 | A | 4/2000 | Hunter |
| 6,218,680 | B1 | 4/2001 | Carter, Jr. et al. |
| 6,396,080 | B2 | 5/2002 | Carter, Jr. et al. |
| 6,403,982 | B2 | 6/2002 | Carter, Jr. et al. |
| 6,639,247 | B2 | 10/2003 | Carter, Jr. et al. |
| 6,749,685 | B2 | 6/2004 | Coleman |
| 6,814,801 | B2 | 11/2004 | Jenny et al. |

(Continued)

FOREIGN PATENT DOCUMENTS

| DE | 102004036295 A1 | 3/2005 |
| EP | 3382068 A1 | 10/2018 |

(Continued)

OTHER PUBLICATIONS

English translation of CN 106025778 A (Year: 2016).*

(Continued)

*Primary Examiner* — Khaja Ahmad
(74) *Attorney, Agent, or Firm* — Sage Patent Group

(57) ABSTRACT

Silicon carbide (SiC) crystalline materials and related methods are disclosed that provide SiC crystalline materials with reduced optical absorption. In certain aspects, SiC crystalline materials with reduced absorption coefficients for wavelengths of light within the visible spectrum are disclosed. Various peaks in absorption over a wavelength spectrum may be reduced in SiC crystalline materials to improve overall absorption coefficient uniformity across the visible spectrum. By providing such improvements in absorption coefficients for SiC crystalline materials, reduced reflection and transmission losses of light in corresponding devices may be realized. Related methods are disclosed that include various combinations of crystalline growth, with and without various post-growth thermal conditioning steps.

19 Claims, 12 Drawing Sheets

(56) References Cited

U.S. PATENT DOCUMENTS

| | | |
|---|---|---|
| 7,147,715 B2 | 12/2006 | Malta et al. |
| 7,192,482 B2 | 3/2007 | Mueller et al. |
| 7,276,117 B2 | 10/2007 | Basceri et al. |
| 7,294,324 B2 | 11/2007 | Powell et al. |
| 7,300,519 B2 | 11/2007 | Tsvetkov et al. |
| 7,314,521 B2 | 1/2008 | Powell et al. |
| 7,316,747 B2 | 1/2008 | Jenny et al. |
| 7,323,051 B2 | 1/2008 | Hobgood et al. |
| 7,323,052 B2 | 1/2008 | Tsvetkov et al. |
| 7,351,286 B2 | 4/2008 | Leonard et al. |
| 7,364,617 B2 | 4/2008 | Mueller et al. |
| 7,387,680 B2 | 6/2008 | Tsvetkov et al. |
| 7,422,634 B2 | 9/2008 | Powell et al. |
| 7,456,035 B2 | 11/2008 | Eliashevich et al. |
| 7,547,897 B2 | 6/2009 | Suvorov |
| 7,563,321 B2 | 7/2009 | Powell et al. |
| 7,601,441 B2 | 10/2009 | Jenny et al. |
| 8,147,991 B2 | 4/2012 | Jenny et al. |
| 8,384,090 B2 | 2/2013 | Powell et al. |
| 8,618,552 B2 | 12/2013 | Powell et al. |
| 8,785,946 B2 | 7/2014 | Powell et al. |
| 8,980,445 B2 | 3/2015 | Leonard et al. |
| 9,018,639 B2 | 4/2015 | Loboda et al. |
| 9,099,377 B2 | 8/2015 | Basceri et al. |
| 9,165,779 B2 | 10/2015 | Oboda et al. |
| 9,200,381 B2 | 12/2015 | Leonard et al. |
| 9,790,619 B2 | 10/2017 | Leonard et al. |
| 10,867,797 B2 | 12/2020 | Suvorov et al. |
| 2003/0233975 A1 | 12/2003 | Jenny et al. |
| 2013/0153928 A1 | 6/2013 | Leonard et al. |
| 2014/0291698 A1 | 10/2014 | Powell et al. |
| 2018/0187332 A1 | 7/2018 | Powell et al. |
| 2020/0027762 A1* | 1/2020 | Pergande ............ H01L 21/0445 |
| 2020/0119217 A1* | 4/2020 | Chava ................ H01L 29/7308 |
| 2021/0269937 A1* | 9/2021 | Zwieback ............ C01B 32/956 |
| 2021/0269938 A1* | 9/2021 | Zwieback ............ C04B 35/573 |

FOREIGN PATENT DOCUMENTS

| | | |
|---|---|---|
| JP | 2004184993 A | 7/2004 |
| JP | 2014004628 A | 1/2014 |
| WO | 2014196437 A1 | 12/2014 |

OTHER PUBLICATIONS

International Search Report and Written Opinion of the International Searching Authority, PCT/US2022/072773, dated Sep. 29, 2022, 15 pages.

Bora, Mihail, "A Total Internal Reflection Photoconductive Switch," IEEE Electron Device Letters, vol. 40, No. 5, May 2009, pp. 734-737.

* cited by examiner

REDUCED OPTICAL ABSORPTION FOR SILICON CARBIDE CRYSTALLINE MATERIALS

FIELD OF THE DISCLOSURE

The present disclosure relates to crystalline materials, and more specifically to silicon carbide crystalline materials with reduced optical absorption.

BACKGROUND

Silicon carbide (SiC) exhibits many attractive electrical and thermophysical properties. SiC is especially useful due to its physical strength and high resistance to chemical attack as well as various electronic properties, including radiation hardness, high breakdown field, a relatively wide band gap, high saturated electron drift velocity, high temperature operation, and absorption and emission of high energy photons in the blue, violet, and ultraviolet regions of the spectrum. Compared with conventional wafer materials, including silicon and sapphire, such properties of SiC make it more suitable for the fabrication of wafers for high power density solid state devices, including power electronic, radio frequency, and optoelectronic devices.

While SiC exhibits superior materials properties, crystal growth techniques required to grow SiC are very different and significantly more challenging than conventional growth processes for other crystalline materials. Conventional crystalline materials utilized in semiconductor manufacturing, such as silicon and sapphire, have significantly lower melting points, allowing for direct crystal growth techniques from melted source materials that enable fabrication of large diameter crystalline materials. In contrast, bulk crystalline SiC is often produced by a seeded sublimation growth process at high temperatures where various challenges include impurity incorporation, structural defects associated with thermal and crystallographic stress, and formation of different polytypes, among others. In a typical SiC growth technique, a substrate and a source material are both placed inside of a reaction crucible. A thermal gradient created when the crucible is heated encourages vapor phase movement of the materials from the source material to the substrate followed by condensation upon the substrate and resulting bulk crystal growth. It is known that impurities can be introduced as dopants into SiC and that these dopants can regulate certain properties. For sublimation growth of SiC, a dopant can be introduced into the chamber in a variety of manners so that the dopant will be present in the SiC crystal produced from that process. The process is controlled to provide an appropriate concentration of the dopant for a particular application. Following bulk crystal growth, individual wafers of SiC may be obtained by slicing a bulk crystal ingot or boule of SiC, and the individual wafers may subsequently be subjected to additional processes, such as lapping or polishing.

The unique properties of SiC wafers enable the design and fabrication of an array of high power and/or high frequency semiconductor devices. Continuous development has led to a level of maturity in the fabrication of SiC wafers that allows such semiconductor devices to be manufactured for increasingly widespread commercial applications. As the semiconductor device industry continues to mature, continued improvement of SiC wafer characteristics is needed to meet the challenging demands of modern semiconductor devices and applications. SiC crystalline materials may also be useful as components of structures beyond semiconductor devices.

The art continues to seek improved SiC crystalline materials, wafers and related devices while overcoming challenges associated with conventional wafers in applications.

SUMMARY

Silicon carbide (SiC) crystalline materials and related methods are disclosed that provide SiC crystalline materials with reduced optical absorption. In certain aspects, SiC crystalline materials with reduced absorption coefficients for wavelengths of light within the visible spectrum are disclosed. Various peaks in absorption over a wavelength spectrum may be reduced in SiC crystalline materials to improve overall absorption coefficient uniformity across the visible spectrum. By providing such improvements in absorption coefficients for SiC crystalline materials, reduced reflection and transmission losses of light in corresponding devices may be realized. Related methods are disclosed that include various combinations of crystalline growth, with and without various post-growth thermal conditioning steps.

In one aspect, a SiC crystalline material comprises an absorption coefficient that is within an absorption coefficient range defined by plus or minus 0.075 reciprocal centimeters ($cm^{-1}$) over a wavelength range from 420 nanometers (nm) to 700 nm. In certain embodiments, the absorption coefficient range is defined by plus or minus 0.05 $cm^{-1}$, or by plus or minus 0.025 $cm^{-1}$ over the wavelength range. In certain embodiments, the SiC crystalline material comprises a diameter that is greater than or equal to 145 mm, or the diameter is in a range from 145 mm to 305 mm. In certain embodiments, the SiC crystalline material comprises a diameter that is greater than or equal to 195 mm, or the diameter is in a range from 195 mm to 305 mm. In certain embodiments, the SiC crystalline material comprises 4H-SiC, or semi-insulating SiC, or n-type SiC, or p-type SiC. In certain embodiments, the absorption coefficient is within another absorption coefficient range defined by plus or minus 0.1 $cm^{-1}$ over another wavelength range from 400 nm to 700 nm. In certain embodiments, the absorption coefficient is within another absorption coefficient range defined by plus or minus 0.075 $cm^{-1}$ over another wavelength range from 400 nm to 700 nm. In certain embodiments, the absorption coefficient is less than or equal to 0.15 $cm^{-1}$ over the wavelength range. In some embodiments, the SiC crystalline material comprises a thickness in a range from 2 mm to 55 mm, or in a range from 100 μm to 2 mm.

In another aspect, a SiC crystalline material comprises an absorption coefficient that is less than 0.15 $cm^{-1}$ over a wavelength range from 420 nm to 700 nm. In certain embodiments, the absorption coefficient is less than 0.1 $cm^{-1}$, or less than 0.07 $cm^{-1}$ over the wavelength range. In certain embodiments, the absorption coefficient is in a range from greater than 0 $cm^{-1}$ to less than 0.15 $cm^{-1}$ over the wavelength range. In certain embodiments, the absorption coefficient is less than 0.06 $cm^{-1}$ over another wavelength range from 450 nm to 680 nm. In certain embodiments, the SiC crystalline material comprises a diameter that is greater than or equal to 145 mm, or the diameter is in a range from 145 mm to 305 mm. In certain embodiments, the SiC crystalline material comprises a diameter that is greater than or equal to 195 mm, or the diameter is in a range from 195 mm to 305 mm. In certain embodiments the SiC crystalline material comprises 4H-SiC, or semi-insulating SiC, or n-type SiC, or p-type SiC. In certain embodiments, the absorption coefficient is less than 0.15 cm$^{-1}$ over another wavelength range from 400 nm to 700 nm, or less than 0.06 cm$^{-1}$ over another wavelength range from 450 nm to 680 nm. In some embodiments, the SiC crystalline material comprises a thickness in a range from 2 mm to 55 mm, or in a range from 100 μm to 2 mm. In certain embodiments, the absorption coefficient is within an absorption coefficient range defined by plus or minus 0.075 cm$^{-1}$ over the wavelength range.

In another aspect, a method comprises: growing a crystalline material of silicon carbide (SiC); and thermally conditioning the crystalline material to provide the crystalline material with an absorption coefficient that is within an absorption coefficient range defined by plus or minus 0.075 cm$^{-1}$ over a wavelength range from 420 nm to 700 nm. In certain embodiments, the absorption coefficient is less than 0.15 cm$^{-1}$ over the wavelength range. In certain embodiments, the thermal conditioning comprises annealing the crystalline material at a temperature in a range from 1300° C. to 2600° C., or in a range from 2000° C. to 2600° C. In certain embodiments, the method further comprises cooling the crystalline material down from the temperature at a rate in a range from 0.5° C. to 5° C. per minute. In certain embodiments, the temperature is in a range from 1300° C. to 2000° C. In certain embodiments, the method further comprises cooling the crystalline material down from the temperature at a rate in a range from above 5° C. to 100° C. per minute. In certain embodiments, the crystalline material comprises a diameter that is greater than or equal to 145 mm, or the diameter is in a range from 145 mm to 305 mm. In certain embodiments, the crystalline material comprises a diameter that is greater than or equal to 195 mm, or the diameter is in a range from 195 mm to 305 mm. In certain embodiments, the crystalline material comprises a SiC wafer that is separated from a SiC crystalline boule before thermally conditioning the crystalline material.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
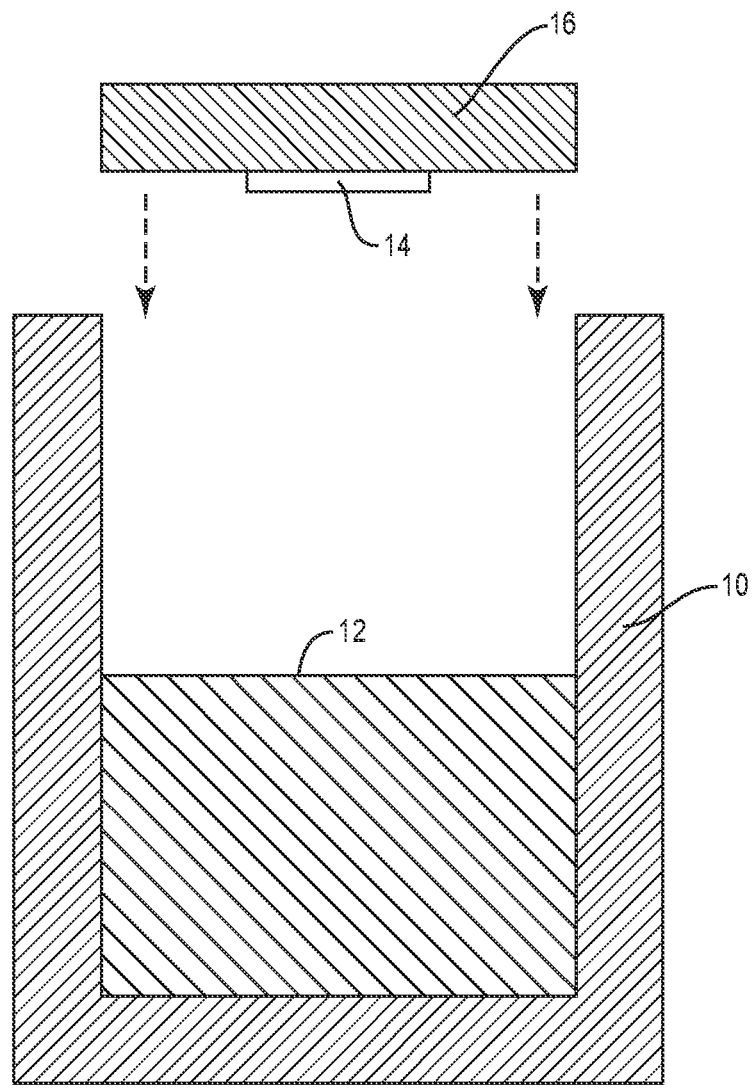
FIG. 1A and FIG. 1B illustrate a process of growing crystalline silicon carbide (SiC) according to embodiments disclosed herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Silicon carbide (SiC) crystalline materials and related methods are disclosed that provide SiC crystalline materials with reduced optical absorption. In certain aspects, SiC crystalline materials with reduced absorption coefficients for wavelengths of light within the visible spectrum are disclosed. Various peaks in absorption over a wavelength spectrum may be reduced in SiC crystalline materials to improve overall absorption coefficient uniformity across the visible spectrum. By providing such improvements in absorption coefficients for SiC crystalline materials, reduced reflection and transmission losses of light in corresponding optoelectronic devices and/or optical components may be realized. Related methods are disclosed that include various combinations of crystalline growth, with and without various post-growth thermal conditioning steps.

General aspects of seeded sublimation growth processes for SiC are well established. As such, those skilled in the field of crystal growth and particularly those skilled in the field of SiC growth and related systems will recognize that specific details of a given technique or process can vary depending on many relevant circumstances, processing conditions, and equipment configurations. Accordingly, the descriptions given herein are most appropriately given in a general and schematic sense with the recognition that those persons of skill in the art will be able to implement and use various embodiments disclosed herein based on the provided disclosure without undue experimentation. Additionally, those skilled in this art will recognize that SiC sublimation systems of the type described herein are commercially available in various standard configurations. Alternately, sublimation systems may be designed and implemented in custom configurations, where necessary or appropriate. Accordingly, the embodiments described herein are not limited to a particular subset of sublimation systems, or any particular system configuration. Rather, many different types and configurations of sublimation systems may be used to grow crystalline SiC material in accordance with embodiments disclosed herein.

Figure 1B:
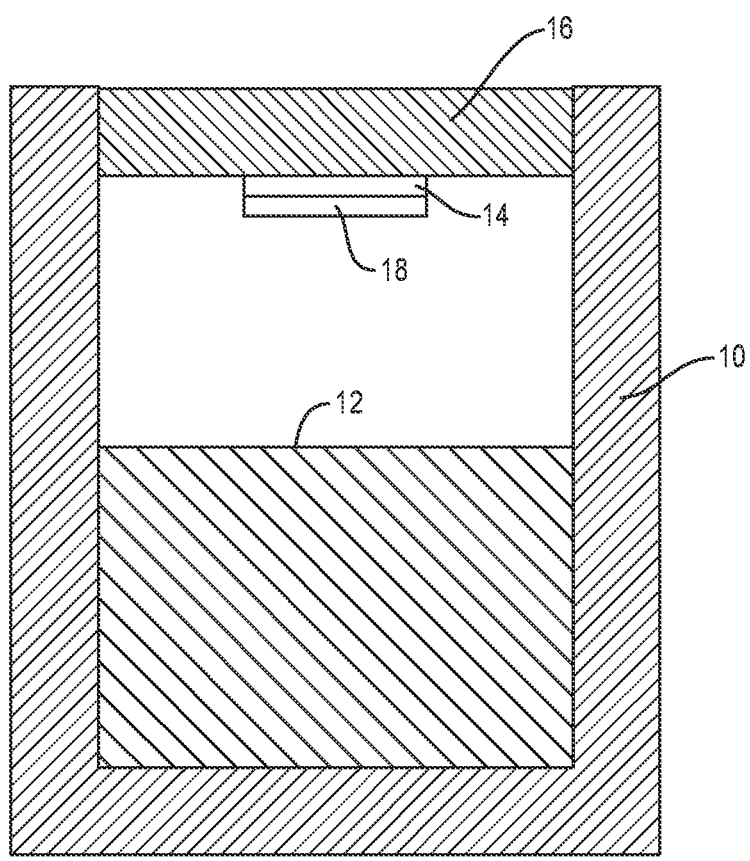

FIG. 1A and FIG. 1B illustrate a process of growing a crystal according to embodiments disclosed herein. In FIG. 1A, a crucible 10 contains source material 12 and an interior of the crucible 10 serves as a growth zone. The source material 12 may include any suitable material such as silicon (Si), carbon (C), SiC, silicon compounds, carbon compounds, or combinations of any or all of the foregoing in any of various forms, including but not limited to one or more combinations of solids, powders, and gases. Other optional elements such as dopants (e.g., nitrogen (N), among others) and strain compensating components (e.g., germanium (Ge), tin (Sn), arsenic (As), and phosphorus (P), among others) may also be included in the source material 12. Strain compensating components, when present, are preferably either isoelectronic or have the same majority carrier type (e.g., n-type or p-type, donor or acceptor) as the dopants. Alternatively, one, some, or all of the other elements can be introduced into the growth zone in ways other than inclusion in the source material 12. A seed 14, such as crystalline SiC, may be placed near a crucible lid 16 that is subsequently placed on the crucible 10 as indicated by the dashed arrows of FIG. 1A. In this manner, the seed 14 is suspended in the crucible 10 above the source material 12 as the crucible 10 is heated. In other arrangements, the seed 14 could be placed anywhere within the crucible 10, such as along bottom or side surfaces of the crucible 10.

During crystal growth, the source material 12 sublimes and forms SiC on the seed 14. Sublimation may occur when the source material 12 is heated to a temperature in a range including 1200° C. to 3000° C., or 1800° C. to 3000° C., or 1800° C. to 2500° C., or 1800° C. to 2000° C., or 2000° C. to 2200° C., among other temperature ranges. While the temperature of the source material 12 is being raised, the temperature of the growth surface of the seed 14 is likewise raised to a temperature approaching the temperature of the source material 12. Typically, the growth surface of the seed 14 is heated to a temperature in a range including 1200° C. to 3000° C., or 1800° C. to 3000° C., or 1800° C. to 2500° C., or 1700° C. to 2400° C., or 1800° C. to 2000° C., or 2000° C. to 2200° C., among other temperature ranges. During the growth process, the crucible 10 is evacuated slowly to reduce and/or maintain pressure. In certain embodiments, growth may be performed at a pressure in a range including 0.1 torr to 50 torr, or 0.1 torr to 25 torr, or 0.1 torr to 15 torr, or 1 torr to 15 torr, among other pressure ranges. Growth temperatures and growth pressures may generally vary with one another. For example, depending on the growth conditions, higher growth temperatures may be associated with higher growth pressures or lower growth temperatures may be associated with lower growth pressures. By maintaining the source material 12 and the growth surface of the seed 14 at their respective temperatures for a sufficient time, macroscopic growth of monocrystalline SiC of a desired polytype may form upon the seed 14.

Turning to FIG. 1B, a SiC crystal 18 is grown from sublimation of the source material 12 in the crucible 10 using a physical vapor transport process. Crystal growth takes place until growth of the SiC crystal 18 reaches a certain length. The length (or height from the seed 14) depends in part on the type of post-formation processing to be employed. The length may also be limited by various crystalline quality characteristics of the SiC crystal 18, including structural crystalline defects. The point where the growth of the SiC crystal 18 is stopped will also depend on such parameters as the size and type of crucible 10 and any concentration of the dopant and strain compensating component when present in the source material 12. This point can be determined in advance through experimental growths coupled with examination of the resulting SiC crystal 18 to determine concentrations of the impurities. Once the SiC crystal 18 has reached the desired size, the system may be backfilled with an inert gas to raise the pressure, and the temperature may slowly be reduced to an intermediate temperature, and then more quickly to room temperature. In certain embodiments, the intermediate temperature may be about 90%, or 80%, or 70% of the growth temperature, among other temperatures. The intermediate temperature may include a range from 150° C. to 2000° C., or 150° C. to 1200° C., or 150° C. to 500° C., or 175° C. to 225° C., among other temperature ranges. The resulting SiC crystal 18 may form a crystalline boule or ingot.

Sublimation growth of SiC can be accomplished with various growth systems, differently sized crucibles, different types of crucibles of various materials and using varying heating methods. Specific growth temperatures and pressures can be adapted by one of skill in the art to accommodate these variables. In the typical case, where such variables as the type or size of the crucible are changed, some experimental growths may need to be performed as mentioned above, to settle on the best growth conditions for a specific system. After crystal growth, the SiC crystal 18 forms a bulk crystalline material, sometimes referred to as a boule or an ingot.

Various microelectronic, optoelectronic, and microfabrication applications require thin layers of crystalline materials (e.g., wafers) as a starting structure for fabricating various useful systems. Various methods for forming thin layers of crystalline materials from bulk crystalline materials include sawing and laser-assisted separation techniques. In certain embodiments, a method for cutting thin layers from crystalline boules or ingots involves the use of wire saws. Wire sawing technology has been applied to various crystalline materials, such as Si, sapphire, and SiC. Another method for separating wafers or substrates from bulk crystalline material comprises a laser-assisted separation technique that includes forming laser subsurface damage within the bulk crystalline material and subsequently separating a wafer from the bulk crystalline material along the laser subsurface damage. Tools for forming subsurface damage in crystalline materials permit laser emissions to be focused within an interior of a crystalline material, and enable lateral movement of a laser relative to the crystalline material. Such laser-assisted separation techniques may provide reduced kerf losses, or total amount of material loss associated with forming an individual wafer, as compared with wire sawing techniques.

As used herein, a "substrate" or a "wafer" refers to a crystalline material, such as a single crystal semiconductor material. In certain embodiments, the terms "substrate" and "wafer" may be used interchangeably as a wafer is typically used as a substrate for semiconductor devices that may be formed thereon. As such, a substrate or a wafer may refer to free-standing crystalline material that has been separated from a larger bulk crystalline material, for example a boule, ingot or larger substrate. In certain embodiments, a wafer may have sufficient thickness (i) to be surface processed (e.g., lapped and/or polished) to support epitaxial deposition of one or more semiconductor material layers, and optionally (ii) to be free-standing if and when separated from a rigid carrier. In certain embodiments, a wafer may have a generally cylindrical or circular shape while in other embodiments, a wafer may have a generally square and/or rectangular shape. In certain embodiments, a wafer may have a thickness of at least about one or more of the following thicknesses: 200 microns (μm), 300 μm, 350 μm, 500 μm, 750 μm, 1 millimeter (mm), 2 mm, or more or less. In other applications, the thickness can be lower or higher for the use in optical components beyond semiconductor devices, such as in a range from 100 μm to 4 mm, or in a range from 100 μm to 55 mm, or in a range from 100 μm to 50 mm, or in a range from 2 mm to 55 mm. In certain embodiments, a wafer may include a thicker wafer that is divisible into two thinner wafers. In certain embodiments, a wafer may be part of a thicker substrate or wafer having one or more epitaxial layers (optionally in conjunction with one or more metal contacts) arranged thereon as part of a device wafer with a plurality of electrically operative devices. The device wafer may be divided in accordance with aspects of the present disclosure to yield a thinner device wafer and a second thinner wafer on which one or more epitaxial layers (optionally in conjunction with one or more metal contacts) may be subsequently formed. In certain embodiments, large diameter wafers may comprise a diameter of approximately 145 mm or greater, or 150 mm or greater, or 195 mm or greater, or 200 mm or greater, or 300 mm or greater, or 450 mm or greater, or in a range from 145 mm to 455 mm, or 145 nm to 305 nm, or 195 nm to 305 nm, or 195 mm to 455 mm, or 145 mm to 205 mm. In certain embodiments, a wafer or substrate may comprise 4H-SiC or 6-H SiC with a diameter of approximately 145 mm or greater, or 150 mm or greater, or 195 mm or greater, or 200 mm or greater, or any of the above specified diameter ranges and a thickness in a range of 100 μm to 1000 μm, or in a range of 100 μm to 800 μm, or in a range of 100 μm to 600 μm, or in a range of 150 μm to 500 μm, or in a range of 150 μm to 400 μm, or in a range of 200 μm to 500 μm, or in a range of 300 μm to 1000 μm, or in a range of 500 μm to 2000 μm, or in a range of 500 to 1500 μm, or in any other thickness range or having any other thickness value specified herein.

With regard to relative dimensions, the term "approximately" is defined to mean a nominal dimension within a certain tolerance, such as plus or minus 5 mm from a diameter dimension. For example, as used herein, a wafer with a "150 mm" diameter may encompass a diameter range including 145 mm to 155 mm, a wafer with a "200 mm" diameter may encompass a diameter range including 195 mm to 205 mm, a wafer with a "300 mm" diameter may encompass a diameter range including 295 mm to 305 mm, and a wafer with a "450 mm" diameter may encompass a diameter range including 445 mm to 455 mm. In further embodiments, such tolerances may be smaller, such as plus or minus 1 mm, or plus or minus 0.25 mm.

Embodiments disclosed herein may be applied to substrates or wafers of various crystalline materials, of both single crystal and polycrystalline varieties. In certain embodiments, substrates or wafers may comprise cubic, hexagonal, and other crystal structures, and may comprise crystalline materials having on-axis and off-axis crystallographic orientations. Exemplary embodiments may include single crystal semiconductor materials having hexagonal crystal structure, such as 4H-SiC or 6H-SiC. Various illustrative embodiments described hereinafter mention SiC generally or 4H-SiC specifically, but it is to be appreciated that other suitable crystalline materials may be used. Among the various SiC polytypes, the 4H-SiC polytype is particularly attractive for power electronic devices due to its high thermal conductivity, wide bandgap, and isotropic electron mobility. The 4H-SiC polytype is also particularly attractive for optoelectronic devices. Embodiments disclosed herein may apply to on-axis SiC (i.e., with no intentional angular deviation from the c-plane thereof) or off-axis SiC (i.e., typically departing from a grown axis such as the c-axis by a non-zero angle, typically in a range of from 0.5 to 10 degrees or a subrange thereof such as 2 to 6 degrees or another subrange). Certain embodiments disclosed herein may utilize on-axis 4H-SiC or vicinal (off-axis) 4H-SiC having an offcut in a range including 1 to 10 degrees, or 2 to 6 degrees, or about 2, 4, 6, or 8 degrees.

Embodiments disclosed herein may also apply to both doped crystalline semiconductor materials (e.g., n-doped conductive SiC and/or p-doped SiC, and/or conductive SiC), co-doped, and/or undoped crystalline semiconductor materials (e.g., semi-insulating SiC or high resistivity SiC). In certain embodiments, SiC crystalline materials, including SiC boules and SiC wafers, may comprise n-type doping (including intentional and unintentional dopants such as N) and/or p-type doping. In other embodiments, higher resistivity SiC crystalline materials, including semi-insulating SiC boules and semi-insulating SiC wafers, may comprise unintentionally doped or undoped SiC. Semi-insulating SiC wafers may be doped with vanadium (V), aluminum (Al), or combinations thereof. Co-doped SiC wafers may comprise combinations of two or more dopants, such as N, Al, V, and B, among others depending on the embodiment.

Crystalline SiC can include various structural crystal defects, including dislocations (e.g., micropipes, threading edge, threading screw and/or basal plane dislocations, among others), hexagonal voids, and stacking faults, among others. Structural crystal defects may be formed during crystal growth and/or during cooldown after growth where one or more discontinuities are formed in the material lattice structure of crystalline SiC. Such structural crystal defects can be detrimental to fabrication, proper operation, device yield, and reliability of semiconductor devices subsequently formed on SiC wafers. The presence of various structural crystal defects can provide stress in freestanding SiC wafers that may contribute to various deviations in wafer shape. The structural defects may also interfere with transmission when SiC crystalline materials are used as optical components in applications beyond discrete semiconductor devices.

Figure 2:
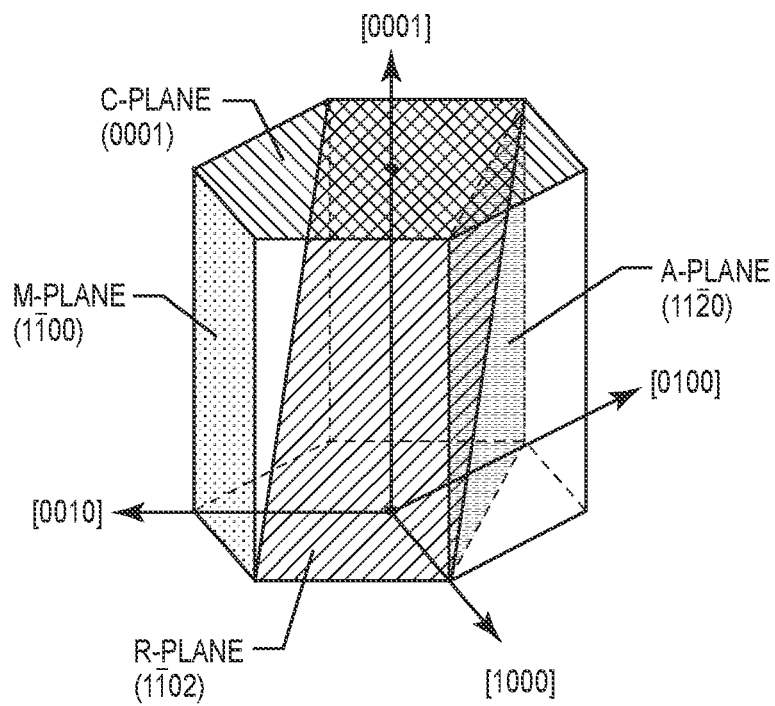
FIG. 2 is a first perspective view crystal plane diagram showing the coordinate system for a hexagonal crystal such as 4H-SiC.

FIG. 2 is a first perspective view crystal plane diagram showing the coordinate system for a hexagonal crystal such as 4H-SiC, in which the C-plane ((0001) plane), corresponding to a [0001] (vertical) crystal direction, is perpendicular to both the M-plane ((1$\bar{1}$00) plane) and the A-plane ((11$\bar{2}$0) plane), and non-perpendicular with the R-plane ((1$\bar{1}$02) plane). On-axis SiC wafers, or C-face SiC crystalline materials, having small offcut (e.g., less than half a degree from the crystallographic c-plane) are frequently employed as growth substrates for high-quality epitaxial growth of homoepitaxial layers of SiC as well as other materials (e.g., aluminum nitride (AlN) and other Group III nitrides). In addition to C-face SiC crystalline materials, the principles of the present disclosure may also apply to one or more of A-face, M-face, and {03$\bar{3}$8}-face SiC crystalline materials. In still further embodiments, the principles of the present disclosure may be applicable for embodiments where SiC crystalline materials are formed in various three-dimensional shapes, such as a prism, to leverage birefringence properties of SiC.

Figure 3:
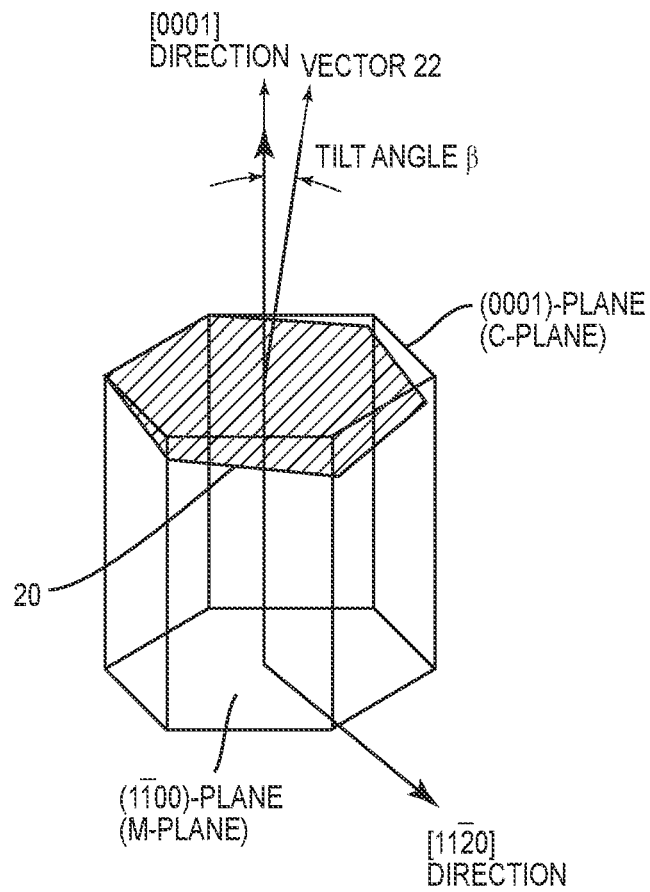
FIG. 3 is a second perspective view crystal plane diagram for a hexagonal crystal, illustrating a plane that is non-parallel to the c-plane.
Figure 4:
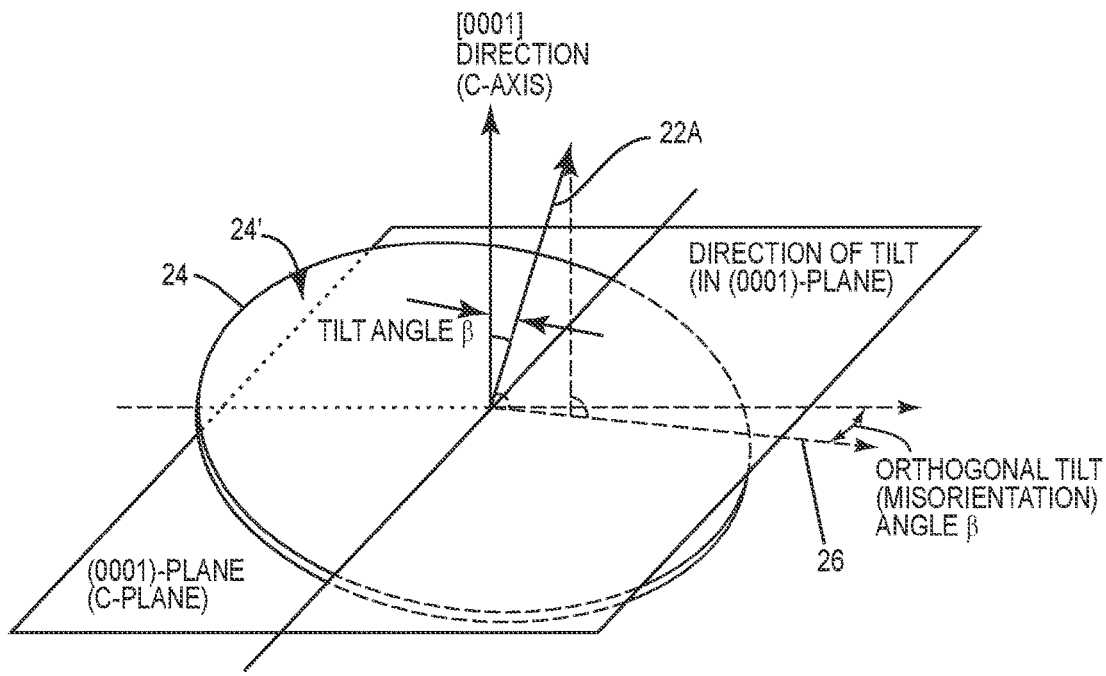
FIG. 4 is a perspective view wafer orientation diagram showing orientation of a vicinal wafer relative to the c-plane.

As described above, it is also possible to produce vicinal (also known as offcut or off-axis) wafers having end faces that are not parallel to the crystallographic c-plane. Vicinal wafers (e.g., of SiC) having various degrees (e.g., 0.1, 0.25, 0.5, 0.75, 1, 2, 4, 6, 8, or more degrees) offcut are frequently employed as growth substrates for high-quality epitaxial growth of homoepitaxial layers of SiC as well as other materials (e.g., AlN and other Group III nitrides). Vicinal wafers may be produced either by growing a boule or ingot in a direction away from the c-axis (e.g., growing over a vicinal seed material and sawing the ingot perpendicular to the ingot sidewalls), or by growing an ingot starting with an on-axis seed material and sawing or cutting the ingot at an angle that departs from perpendicular to the ingot sidewalls. FIG. 3 is a second perspective view crystal plane diagram for a hexagonal crystal, illustrating a plane 20 that is non-parallel to the c-plane, wherein a vector 22 (which is normal to the plane 20) is tilted away from the [0001] direction by a tilt angle β, with the tilt angle β being inclined (slightly) toward the [11$\bar{2}$0] direction. FIG. 4 is a perspective view wafer orientation diagram showing orientation of a vicinal wafer 24 relative to the c-plane ((0001) plane), in which a vector 22A (which is normal to a wafer face 24') is tilted away from the [0001] direction by the tilt angle β. This tilt angle β is equal to an orthogonal tilt (or misorientation angle) β that spans between the (0001) plane and a projection 26 of the wafer face 24'.

Figure 5A:
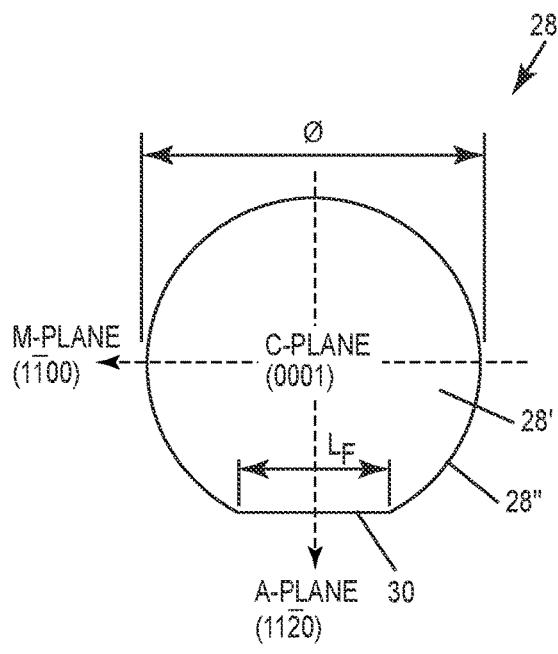
FIG. 5A and FIG. 5B are top plan views of exemplary SiC wafers, with superimposed arrows showing crystallographic planes.
Figure 5B:
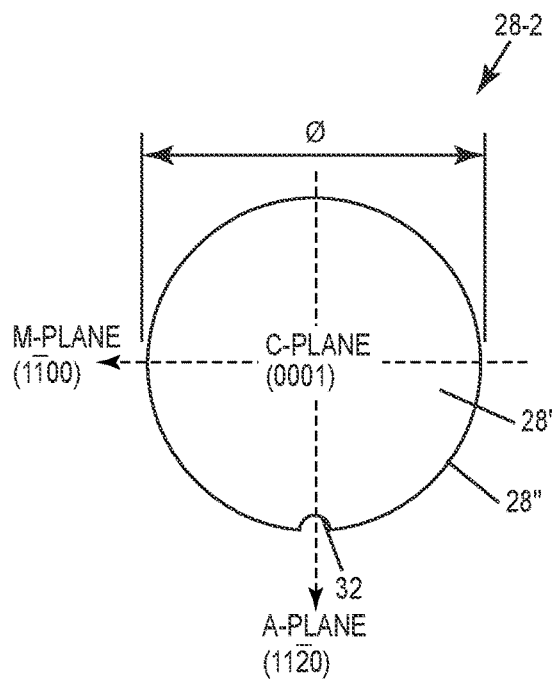

FIGS. 5A and 5B are top plan views of exemplary SiC wafers 28-1, 28-2 that include an upper face 28' (e.g., that is parallel to the (0001) plane (c-plane) and perpendicular to the [0001] direction) and are laterally bounded by a generally round edge 28" (having a diameter Ø). In FIG. 5A, the round edge 28" of the SiC wafer 28-1 includes a primary flat 30 (having a length $L_F$) that is perpendicular to the (11$\bar{2}$0) plane, and parallel to the [11$\bar{2}$0] direction. In FIG. 5B, the round edge 28" of the SiC wafer 28-2 includes a notch 32 in place of the primary flat 30 illustrated in FIG. 5A. Depending on the particular application, the notch 32 may be provided for compatibility with various semiconductor manufacturing tools on which the SiC wafer 28-2 may be processed. As previously described, the SiC wafers 28-1, 28-2 may also be misaligned with (e.g., off-axis at an oblique angle relative to) the c-plane.

SiC wafers may be employed as growth and/or carrier substrates for optoelectronic devices, including light-emitting diodes. Many device fabrication steps may predominantly occur at the wafer level, before individual optoelectronic devices are singulated from a corresponding SiC wafer. In this regard, each individual optoelectronic device may include a portion of the original SiC wafer that serves as a device substrate. In many applications, light generated by the optoelectronic devices may interact with the portion of the SiC wafer (e.g., device substrate) that remains. Certain geometries of optoelectronic devices, such as so-called flip-chip devices, may further be arranged so that generated light emissions intentionally pass through the SiC material of the device substrate. According to principles of the present disclosure, SiC wafers are provided with reduced absorption coefficients for wavelengths of light across the visible spectrum, thereby improving brightness and efficiency of corresponding optical and/or optoelectronic devices. In certain aspects, various peaks in the absorption coefficient over a wavelength spectrum are reduced in SiC wafers to improve overall absorption coefficient uniformity across the visible spectrum. Accordingly, reduced reflection and transmission losses of light in corresponding optoelectronic devices may be realized.

In certain embodiments, SiC crystalline materials with absorption coefficient values and uniformities according to the present disclosure may be useful in applications beyond discrete optoelectronic devices. For example, SiC crystalline materials according to the present disclosure may form optical components for visual applications that use such optical components for transmission and/or reflectance of light through the optical component. Exemplary optical components include optical flats, optical lenses, and optical windows. In certain embodiments, other optical components may include one or more of a substrate, a waveguide, and a mirror. In still further embodiments, crystalline materials of the present disclosure may be used for components and/or integrated components in quantum computing applications, such as storage of quantum bits.

Figure 6:
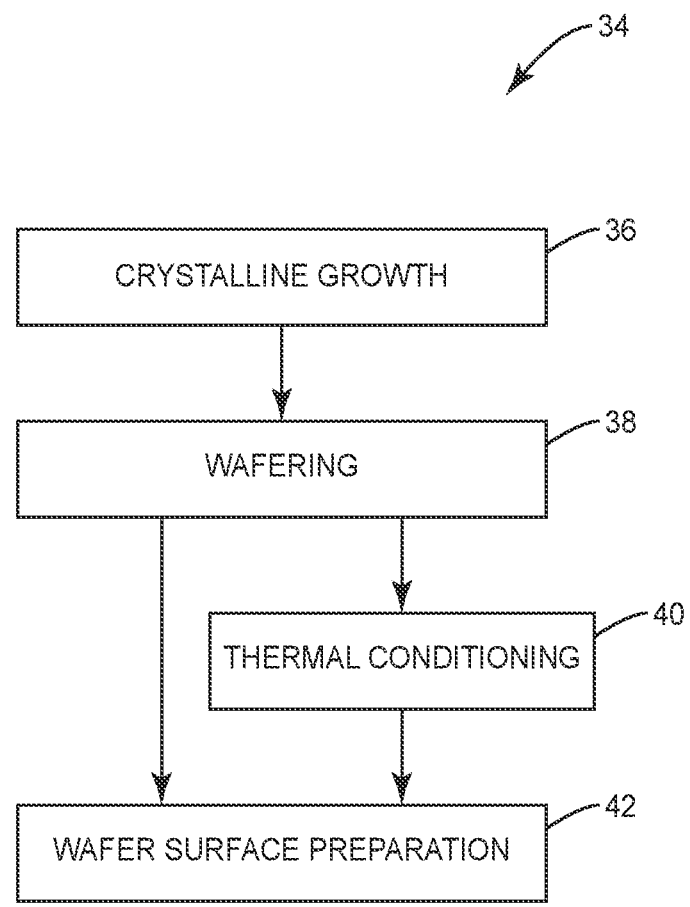
FIG. 6 is a process flow chart illustrating an exemplary fabrication sequence for providing SiC crystalline materials with reduced optical absorption coefficients according to aspects of the present disclosure.
Figure 7A:
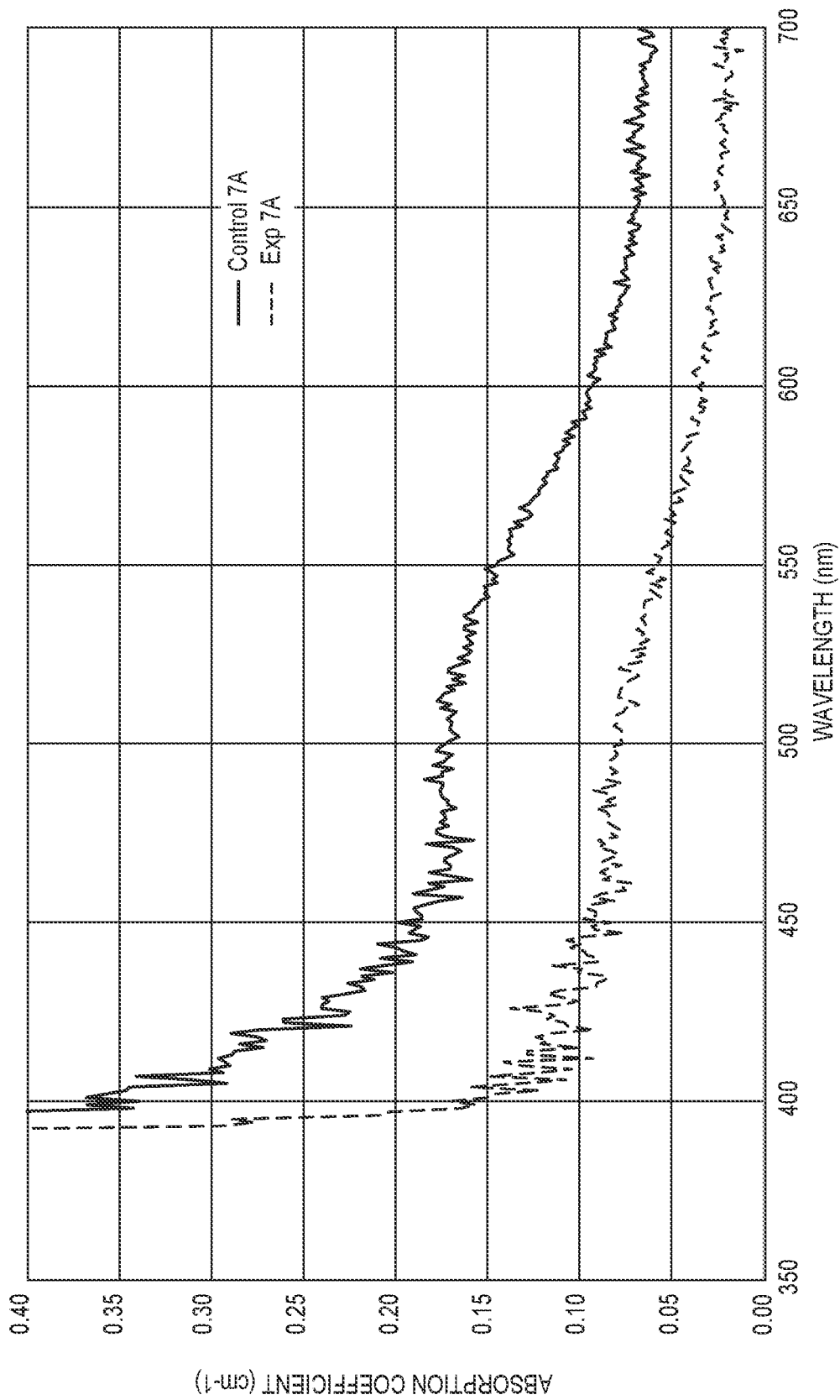
FIG. 7A is a graph representing absorption coefficient values across a wavelength range of the visible spectrum for SiC wafers with and without conventional thermal conditioning, where the SiC wafers were selected from adjacent portions of a same crystalline boule.
Figure 7B:
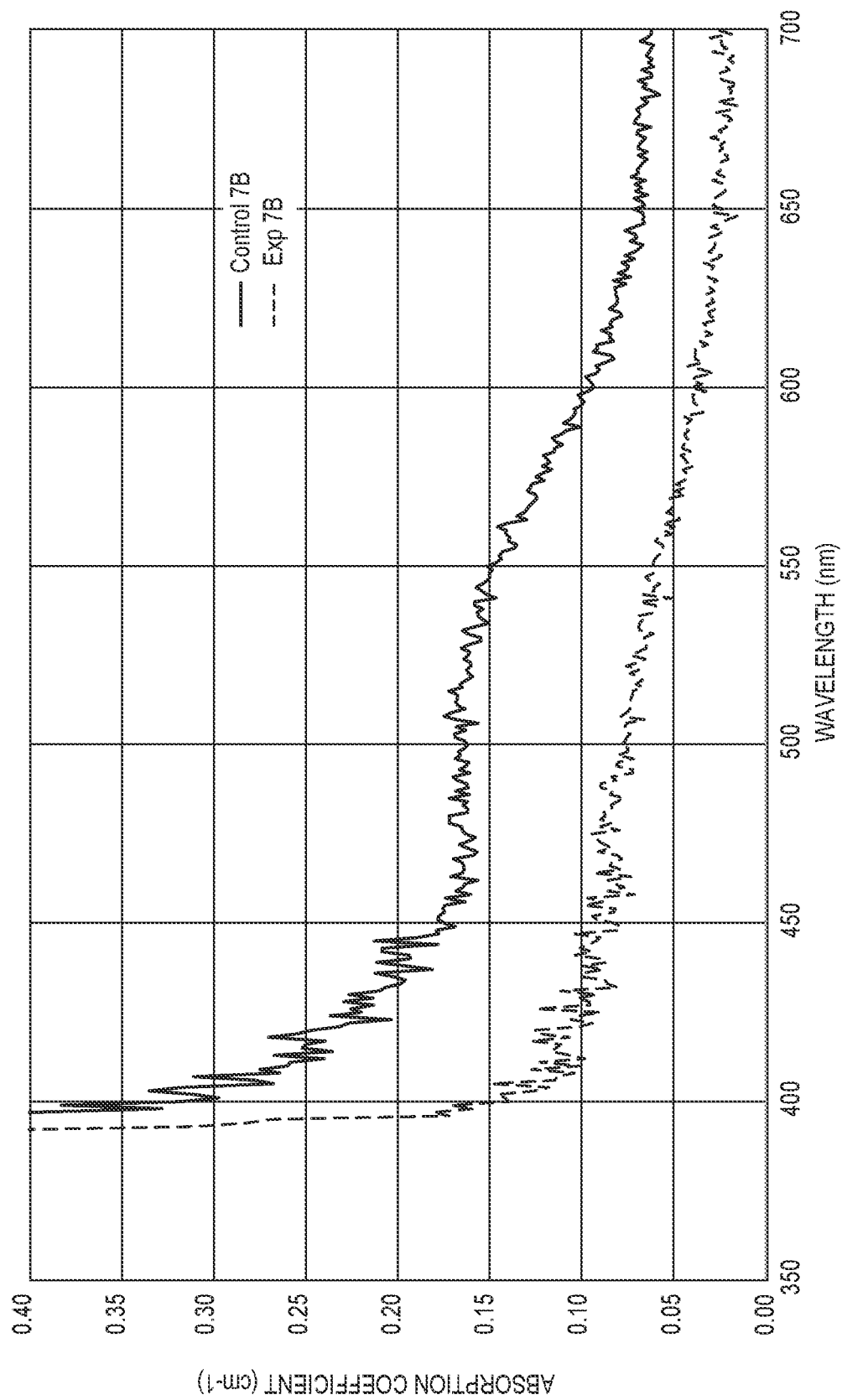
FIG. 7B is a graph similar to the graph of FIG. 7A, for two other SiC wafers from adjacent portions of the same crystalline boule as FIG. 7A, with and without conventional thermal conditioning.
Figure 7C:
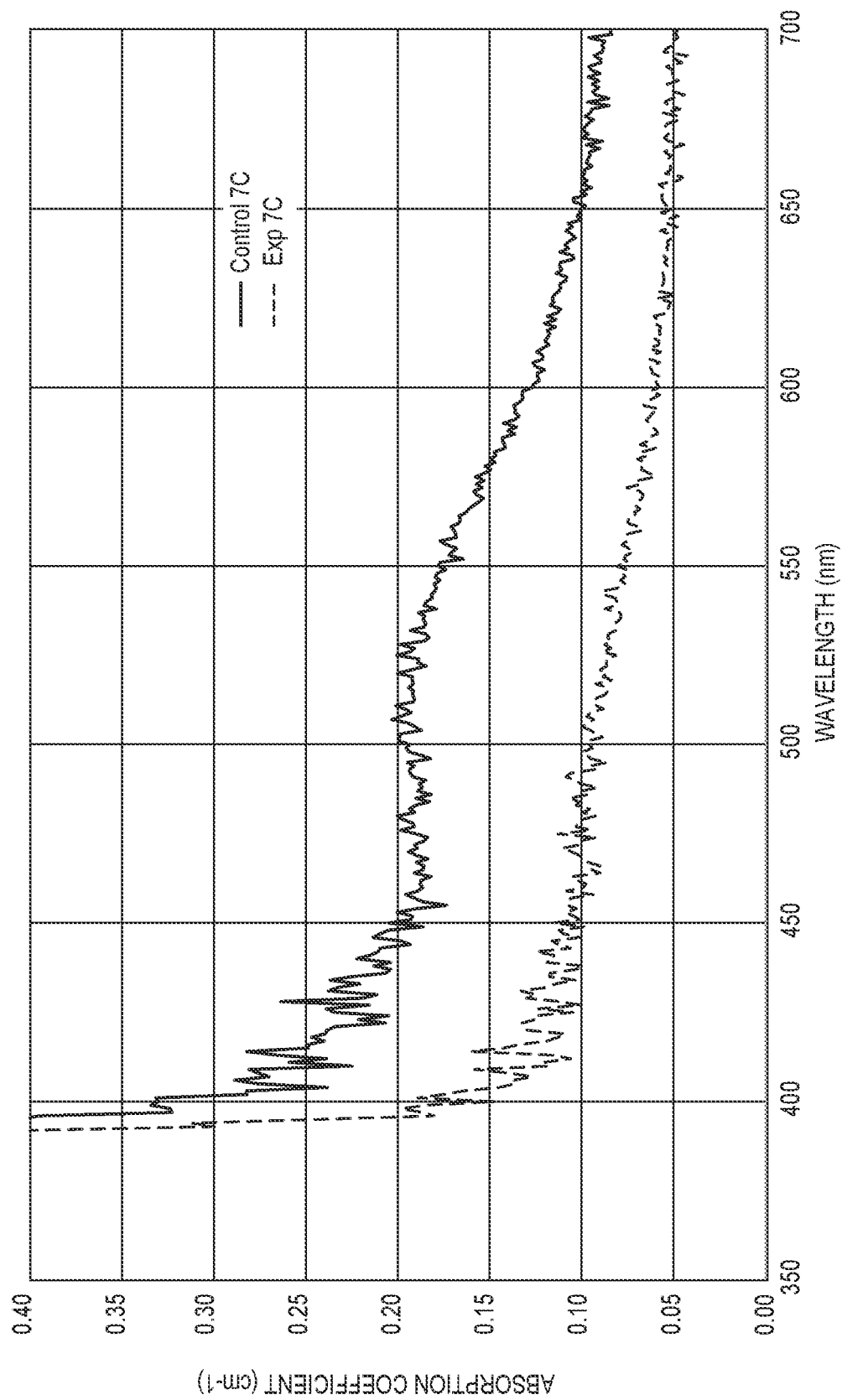
FIG. 7C is a graph similar to the graph of FIG. 7A, for two other SiC wafers from adjacent portions of the same crystalline boule as FIG. 7A, with and without conventional thermal conditioning.
Figure 7D:
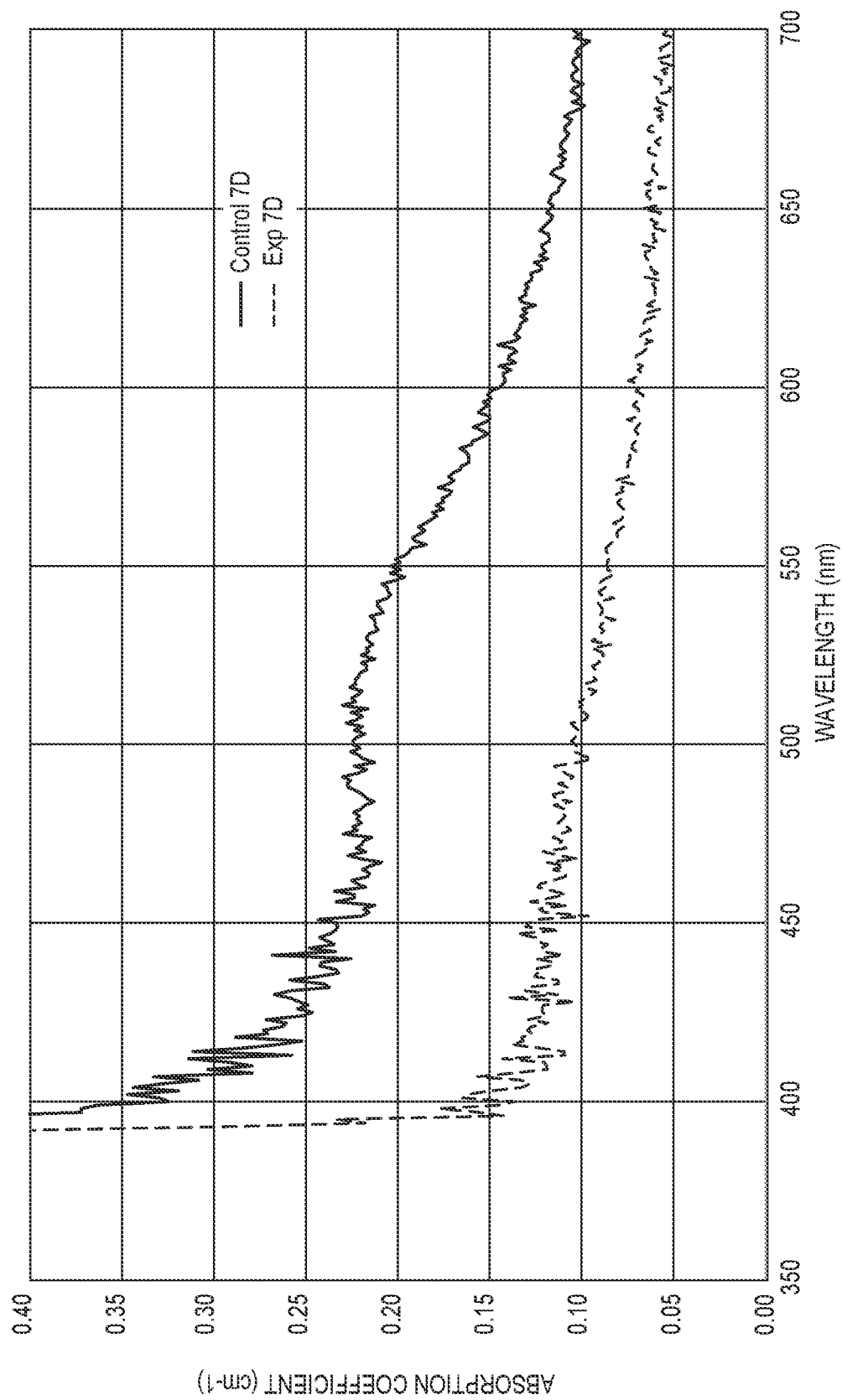
FIG. 7D is a graph similar to the graph of FIG. 7A, for two other SiC wafers from adjacent portions of the same crystalline boule as FIG. 7A, with and without conventional thermal conditioning.

FIG. 6 is a process flow chart 34 illustrating an exemplary fabrication sequence for providing SiC crystalline materials, such as SiC wafers, with reduced optical absorption coefficients according to aspects of the present disclosure. At a first step 36, crystalline growth of bulk SiC may occur as generally described above for FIGS. 1A and 1B. Depending on the application, the SiC crystalline material may embody doped crystalline material (e.g., n-doped SiC and/or p-doped SiC), co-doped, or undoped crystalline materials (e.g., semi-insulating SiC, high-purity semi-insulating material SiC, and/or high resistivity SiC). For n-doped SiC, the SiC crystalline material may be actively doped with N or passively doped with background N that may be present in the growth system. Boron (B) may be unintentionally introduced during crystalline growth as an element present in growth system components and/or raw materials. For n-doped SiC, the N doping levels may typically be provided at concentrations that maintain n-type doping despite any compensating B or other p-type dopants that may be present. However, higher N doping in SiC crystalline materials may serve to increase optical absorption coefficients across various wavelengths of the visible spectrum. In certain embodiments, n-type SiC may be grown according to the first step 36 with low absorption coefficients by reducing N doping levels while still maintaining n-type crystalline SiC. This may be accomplished by providing reduced N doping alone or in combination with introducing strain compensating dopants that have an n-type majority carrier type. The principles described above for n-type crystalline SiC may also be applicable to p-type crystalline SiC where certain p-type dopants may be reduced and strain compensating dopants having a p-type majority carrier may be optionally introduced. For growth of semi-insulating SiC, the B concentration may be controlled through purification and re-introduction to maintain only enough p-type dopant concentration in the crystalline material to compensate any N that may unintentionally be present. However, the growth and post growth processing of the semi-insulating SiC may introduce other defect levels that increase optical absorption coefficients. As will be described in greater detail below, SiC crystalline materials may be provided with reduced optical absorption coefficients by various growth and/or post-growth processing steps.

At a second step 38, the SiC bulk crystalline material from the first step 36 may be sliced into individual SiC wafers (e.g., wafering). For embodiments related to SiC crystalline materials beyond SiC wafers, the second step 38 may be omitted. At a third step 40, the SiC wafers or SiC crystalline materials may be subjected to a thermal conditioning process. In other embodiments, thermal conditioning may be performed at a boule level. For conventional semi-insulating SiC, thermal conditioning typically involves subjecting the SiC wafers to an annealing process that promotes formation and retention of intrinsic defects within the SiC wafers. The typical thermal conditioning sequence may involve anneal temperatures above 2000° C. followed by a rapid cooldown. The intrinsic defects may form deep level crystalline defects that are outside of the valence and conduction bands, thereby providing traps for electrons and/or holes in order to provide semi-insulating properties. However, such intrinsic defects can sometimes increase optical absorption coefficients. According to aspects of the present disclosure, the thermal conditioning step may be modified or even eliminated in order to provide SiC wafers or SiC crystalline materials with reduced optical absorption coefficients. In certain embodiments, the SiC wafers, SiC boules, or other SiC crystalline materials may be subjected to thermal conditioning at the third step 40 where an anneal is provided at a temperature that induces intrinsic defects, for example in a range from 1300° C. to 2600° C., or in a range from 2000° C. to 2600° C., or in a range from 2200° C. to 2500° C., or in a range from 1300° C. to 2000° C., or in a range from 1300° C. to 1900° C., or in a range from 1400° C. to 1900° C. Depending on the temperature range or sub-range selected, the rate of cooldown to room temperature may involve gradual cooling or rapid cooling to provide control over amounts of intrinsic defects that remain versus amounts of intrinsic defects that are eliminated. For example, in one example of the thermal conditioning step, SiC crystalline materials may be annealed at temperatures of at least 2000° C., or in a range from 2000° C. to 2600° C., for a time period in a range from 30 minutes to 120 minutes, followed by a gradual cooldown that allows some intrinsic defects to diffuse and eliminate themselves, thereby reducing amounts of intrinsic defects that may otherwise cause higher optical absorption. The gradual cooldown may comprise a rate of cooling in a range from 0.5° C. per minute to 12° C. per minute, or in a range from 0.5° C. per minute to 5° C. per minute, or in a range from 0.5° C. per minute to 3° C. per minute, or in a range from 0.5° C. per minute to 2° C. per minute, or in a range from 0.5° C. per minute to 1.5° C. per minute, or in a range from 1° C. per minute to 5° C. per minute, or in a range from 1°

C. per minute to 3° C. per minute, or in a range from 1° C. per minute to 2° C. per minute. In another example of the thermal conditioning step, SiC wafers may be annealed at temperatures of less than or equal to 2000° C., or in a range from 1300° C. to 2000° C., or in a range from 1400° C. to 1900° C. for a time period in a range from 30 minutes to 120 minutes, followed by a more rapid cooldown. The more rapid cooldown may involve various cooling rates that are above 5° C. per minute, such as in a range from above 5° C. to about 20° C. per minute, or in a range from 5° C. to about 100° C. per minute, or in a range from 20° C. to about 100° C. per minute. In still further examples of the thermal conditioning step, SiC crystalline materials may be annealed at temperatures in a range from 2000° C. to 2600° C., followed by gradual cooling to a lower temperature that is in a range from 1300° C. to 2000° C., followed by rapid cooldown. In view of the above examples, the thermal conditioning step of the present disclosure may involve different combinations of anneal temperatures and rates of cooling to control amounts of intrinsic defects in SiC crystalline materials. In this manner, the thermal conditioning step may provide fine tuning capabilities so that resulting SiC wafers or other crystalline materials may be tailored to provide various optical absorption coefficient profiles for various optoelectronic applications and/or optical component applications. In certain embodiments, such thermal conditioning may activate unincorporated dopants that may further compensate existing dopants in the SiC crystalline material. In still further embodiments, the crystal growth of the first step 36 according to the present disclosure may be sufficient to provide suitable absorption coefficients without requiring any thermal conditioning. In such embodiments, the third step 40 may be omitted and the SiC crystalline materials may proceed to a fourth step 42 of wafer surface preparation. Wafer surface preparation may include surface cleaning, polishing, etc. In certain embodiments, wafer surface preparation may involve one or more of chemical mechanical polishing (CMP), oxidation, wet etching, dry etching, and/or reactive ion etching, to one or both sides of a wafer. For n-type and p-type SiC wafers, fabrication may include the thermal conditioning of the third step 40 as described above, or the third step 40 may be omitted. For embodiments related to SiC crystalline materials beyond SiC wafers, the fourth step 42 may be omitted.

Figure 8:
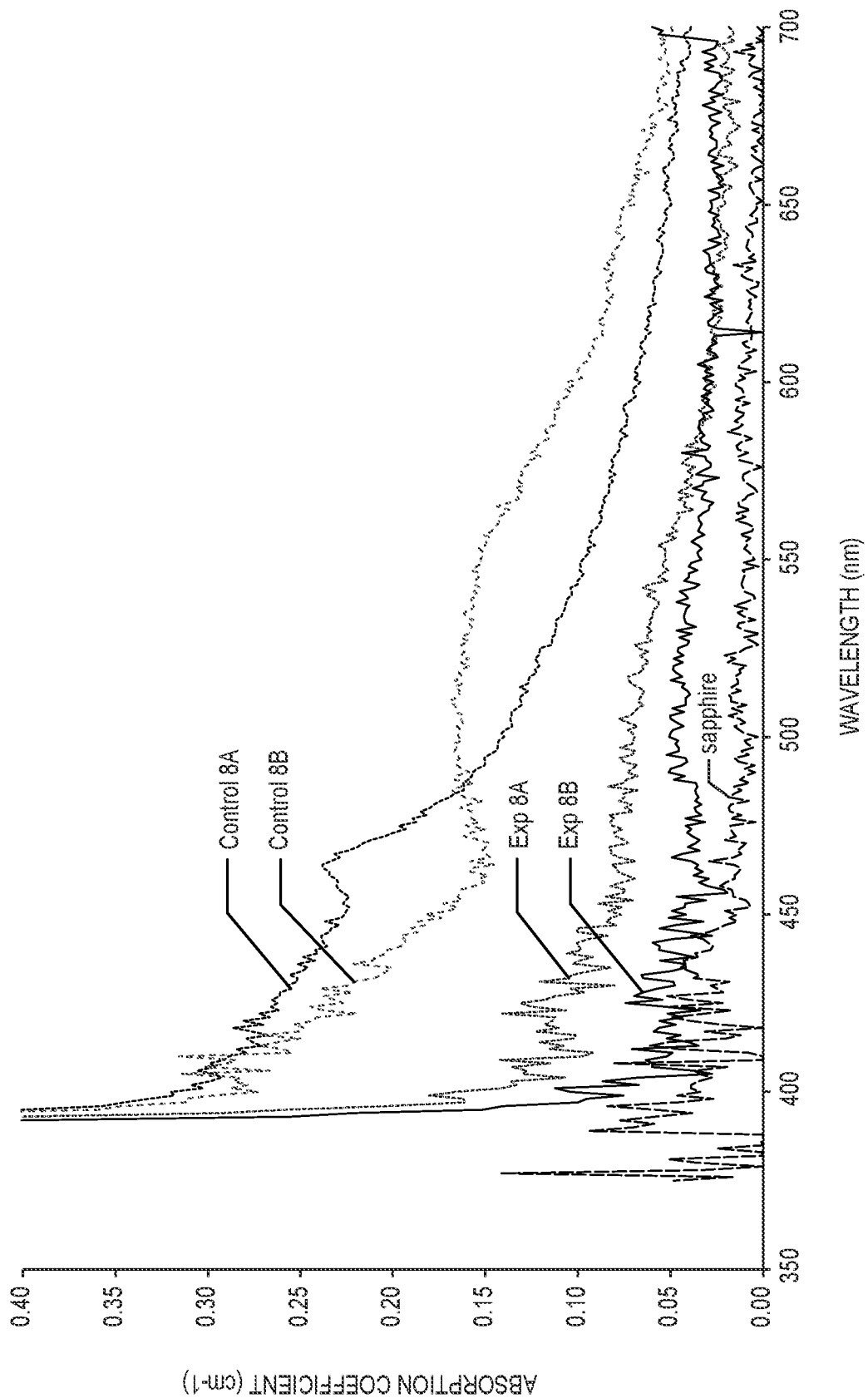
FIG. 8 is a graph representing absorption coefficient values across a wavelength range of the visible spectrum comparing conventional n-type SiC wafers, conventional semi-insulating SiC wafers, and conventional sapphire wafers with SiC wafers according to the present disclosure.
Figure 9:
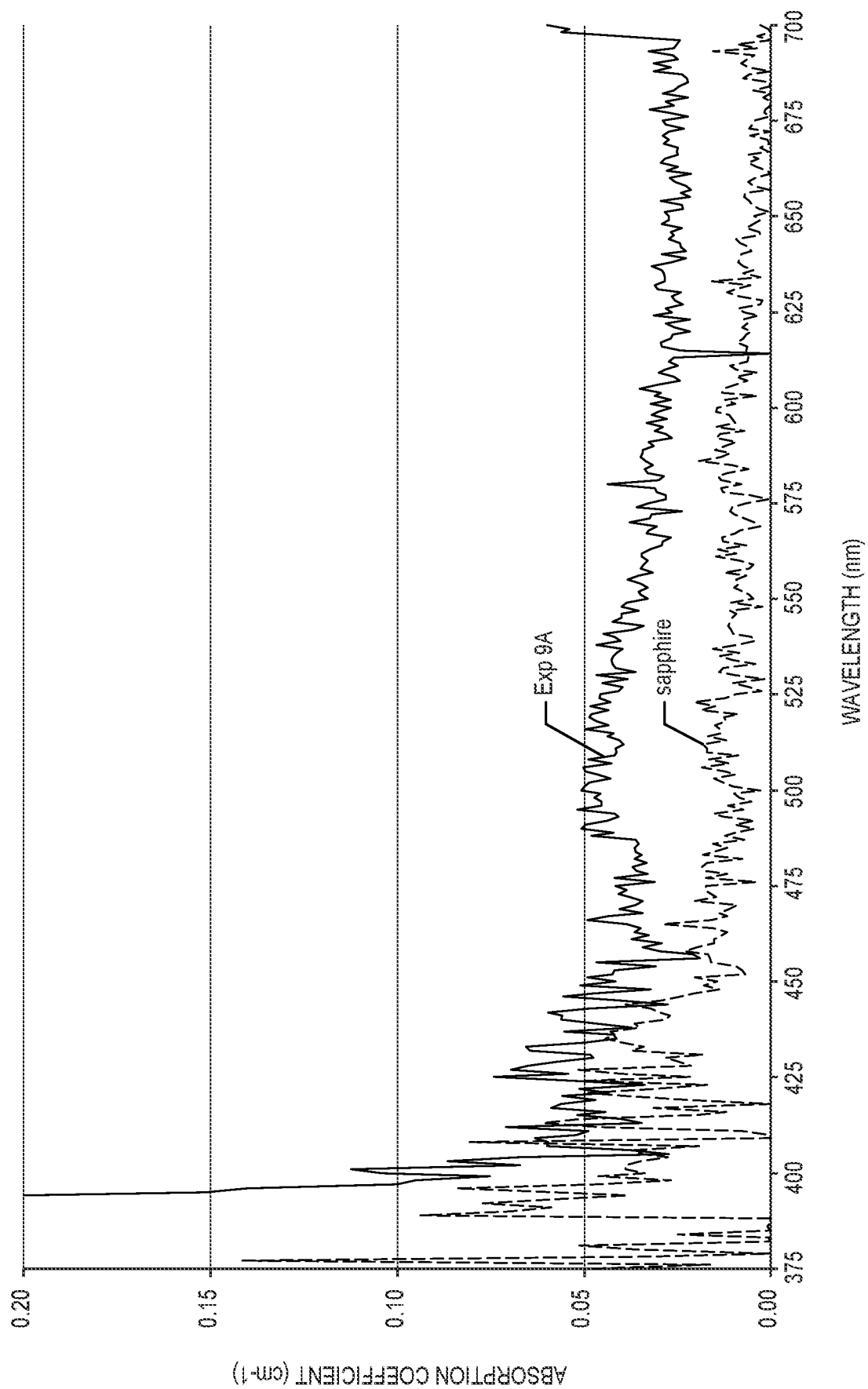
FIG. 9 is a graph representing absorption coefficient values across a wavelength range of the visible spectrum for one wafer from the experiment population of FIG. 8 as compared with the conventional sapphire wafer from FIG. 8.

In FIGS. 7-10, absorption coefficient values across a wavelength range of the visible spectrum are provided comparing various SiC wafers of the present disclosure with conventional wafers. For the purposes of present disclosure, measured absorption coefficients of SiC wafers are based on calculations according to the well-known Beer's law (i.e., Beer-Lambert law). However, it is expected that the absorption coefficient calculations may also be performed according to other well-known calculations with the same or only minor deviations in calculated values. In FIGS. 7-9, absorption coefficient values were collected for various wafers with an ultraviolet-visible (UV-Vis) spectrophotometer. Additionally, all of the SiC wafers represented in FIGS. 7-10 were subjected to double-sided CMP processing. In certain embodiments, the values reflected in FIGS. 7-10 are representative of central areas of such SiC wafers. SiC wafers according to principles of the present disclosure may have diameters of 145 mm or greater, or 150 mm or greater, or 195 mm or greater, or 200 mm or greater, or 295 mm or greater, or 300 mm or greater, or any range including the aforementioned values with an upper boundary of 205, mm, 305 mm, or 450 mm, or more, and with any of the previously described thickness ranges, for example a thickness in a range of 100 μm to 1000 μm, or in a range of 100 μm to 800 μm, or in a range of 100 μm to 600 μm, or in a range of 150 μm to 500 μm, or in a range of 150 μm to 400 μm, or in a range of 200 μm to 500 μm, or in a range of 300 μm to 1000 μm, or in a range of 500 μm to 2000 μm, or in a range of 500 μm to 1500 μm.

FIGS. 7A to 7D are graphs representing absorption coefficient values across a wavelength range of the visible spectrum for SiC wafers with and without conventional thermal conditioning. The x-axis represents the wavelength range in nanometers (nm) and the y-axis represents the absorption coefficient in reciprocal centimeters ($cm^{-1}$). In FIGS. 7A to 7D, a control population (labeled as Control 7A to 7D) represents SiC wafers that were subjected to conventional thermal conditioning as described above and an experiment population (labeled as Exp 7A to 7D) represents SiC wafers that were not subjected to any thermal conditioning. Both the control population wafers and the experiment population wafers were from a same bulk crystalline boule. For comparison purposes, the wafers labeled Exp 7A and Control 7A of FIG. 7A were taken from adjacent portions of the crystalline boule. The same relationship applied to the other wafer pairs (i.e., Exp 7B and Control 7B of FIG. 7B, Exp 7C and Control 7C of FIG. 7C, and Exp 7D and Control 7D of FIG. 7D). As illustrated in each of FIGS. 7A-7D, the experiment population exhibited noticeably reduced optical absorption coefficients throughout the visible spectrum, including wavelengths in a range from 420 nm to 700 nm. For example, the experiment population exhibited absorption coefficients that are less than 0.15 $cm^{-1}$, or in a range from greater than 0 $cm^{-1}$ to less than 0.15 $cm^{-1}$ over a wavelength range from 420 nm to 700 nm, or from 450 nm to 700 nm. The experiment population also exhibited absorption coefficients that are less than 0.2 $cm^{-1}$, or in a range from greater than 0 $cm^{-1}$ to less than 0.2 $cm^{-1}$ over a wavelength range from 400 nm to 700 nm. Additionally, the experiment population exhibited improved uniformity of absorption coefficient values over the 420 nm to 700 nm wavelength range. For example, the absorption coefficient of the experiment population may be within an absorption coefficient range defined by plus or minus 0.075 $cm^{-1}$ over the 420 nm to 700 nm wavelength range. As used herein, plus or minus a value may be used to define the minimum and maximum values for a particular range of values. In the example above, an absorption coefficient range defined by plus or minus 0.075 $cm^{-1}$ may generally refer to an absorption coefficient range defined by a minimum and a maximum value that are 0.15 $cm^{-1}$ apart. In this regard, crystal growth conditions of the present disclosure in combination with the absence of conventional thermal conditioning treatments may provide SiC wafers with reduced absorption coefficient values.

FIG. 8 is a graph representing absorption coefficient values across a wavelength range of the visible spectrum comparing conventional n-type SiC wafers, conventional semi-insulating SiC wafers, and conventional sapphire wafers with SiC wafers according to the present disclosure. The x-axis represents the wavelength range in nm and the y-axis represents the absorption coefficient in $cm^{-1}$. In FIG. 8, a control population is represented by an n-type wafer (labeled as Control 8A) and a semi-insulating wafer (labeled as Control 8B). The semi-insulating wafer was subjected to conventional thermal conditioning as described above. The experiment population (labeled as Exp 8A to 8B) represents SiC wafers that were not subjected to any thermal conditioning. As with FIGS. 7A-7D, the experiment population exhibited noticeably reduced optical absorption coefficients throughout the visible spectrum, including wavelengths in a range from 420 nm to 700 nm. For example, both experiment populations exhibited absorption coefficients that are below 0.15 cm$^{-1}$ and that deviate no more than 0.15 cm$^{-1}$ in the 420 nm to 700 nm wavelength range. Additionally, the experiment population Exp 8B exhibited absorption coefficients close to those of sapphire, as will be further described below for FIG. 9.

FIG. 9 is a graph representing absorption coefficient values across a wavelength range of the visible spectrum for one wafer from the experiment population of FIG. 8 as compared with the conventional sapphire wafer from FIG. 8. As illustrated in FIG. 9, the experiment wafer Exp 8B exhibits absorption coefficient values that are not far from those of sapphire. For example, the Exp 8B wafer exhibited absorption coefficients that are less than 0.15 cm$^{-1}$, or less than 0.1 cm$^{-1}$, or less than 0.075 cm$^{-1}$, or in any range from greater than 0 cm$^{-1}$ to any of the just specified values over a wavelength range from 400 nm to 700 nm, or from 420 nm to 700 nm, or from 450 nm to 700 nm. The Exp 8B wafer further demonstrated absorption coefficients that are less than 0.06 cm$^{-1}$ for another wavelength range from 450 nm to 680 nm. As for uniformity of absorption coefficient values, the experiment population exhibited absorption coefficients over the 420 nm to 700 nm wavelength range that were within an absorption coefficient range defined by plus or minus 0.075 cm$^{-1}$, or plus or minus 0.05 cm$^{-1}$, or plus or minus 0.025 cm$^{-1}$.

Figure 10:
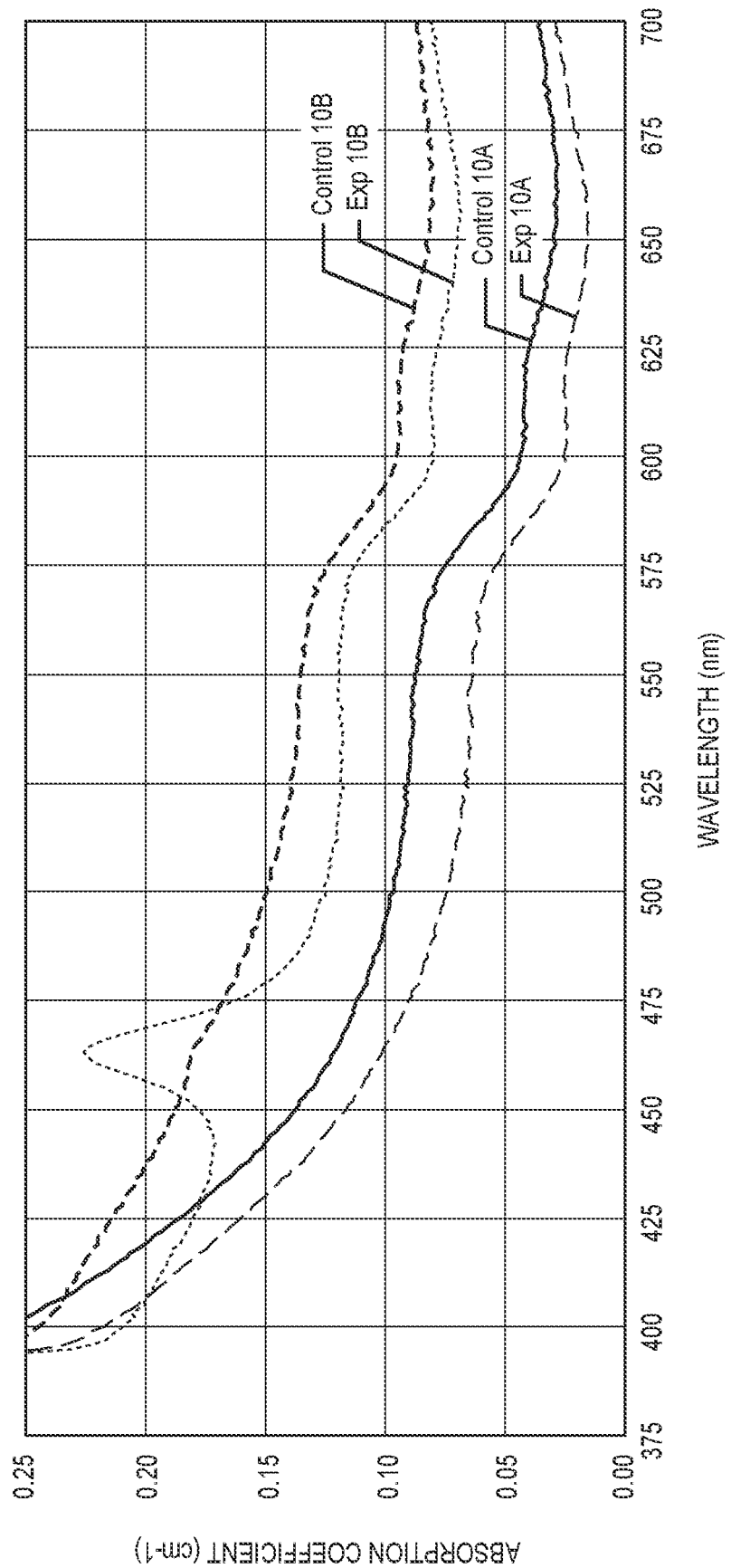
FIG. 10 is a graph representing absorption coefficient values across a wavelength range of the visible spectrum for SiC wafers without any thermal conditioning compared with SiC wafers with thermal conditioning according to principles of the present disclosure.

FIG. 10 is a graph representing absorption coefficient values across a wavelength range of the visible spectrum for SiC wafers without any thermal conditioning compared with SiC wafers with thermal conditioning according to principles of the present disclosure. In FIG. 10, a control population is represented by two SiC wafers that did not receive conventional thermal conditioning (labeled as Control 10A and 10B). Adjacent wafers from the same crystalline boule are respectively labeled as Exp 10A and 10B, where the Exp 10A wafer was taken from an adjacent portion of the same crystalline boule as the Control 10A wafer and the same relationship was also provided for the Exp 10B and Control 10B wafers. The Exp 10A and 10B wafers were subjected to the thermal conditioning step of the present disclosure as described above for FIG. 6. As illustrated, Exp 10A and 10B wafers exhibited reduced absorption coefficient values as compared to the Control 10A and 10B wafers that did not receive any thermal conditioning. In this regard, certain embodiments of the present disclosure provide thermal conditioning steps that may be tailored to further reduce absorption coefficient values compared with just omitting conventional thermal conditioning. It is also appreciated that the Exp 10B wafer shows a peak in absorption coefficient values between 450 nm and 475 nm, indicative of n-type doping characteristics, while still demonstrating reduced absorption coefficient values in all other wavelength ranges. In this regard, crystal growth combined with thermal conditioning according to the present disclosure may provide reduced absorption coefficient values for various types of SiC wafers, including n-type SiC wafers.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A silicon carbide (SiC) crystalline material, comprising an absorption coefficient that is within an absorption coefficient range defined by a minimum value and a maximum value that are 0.15 centimeters (cm$^{-1}$) apart over a wavelength range from 420 nanometers (nm) to 700 nm.

2. The SiC crystalline material of claim 1, wherein the absorption coefficient range is defined by the minimum value and the maximum value that are 0.1 cm$^{-1}$ apart over the wavelength range.

3. The SiC crystalline material of claim 1, wherein the absorption coefficient range is defined by the minimum value and the maximum value that are 0.05 cm$^{-1}$ apart over the wavelength range.

4. The SiC crystalline material of claim 1, wherein the SiC crystalline material comprises a diameter that is greater than or equal to 145 mm.

5. The SiC crystalline material of claim 4, wherein the diameter is in a range from 145 mm to 305 mm.

6. The SiC crystalline material of claim 1, wherein the SiC crystalline material comprises one of 4H-SiC, semi-insulating SiC, n-type SiC, and p-type SiC.

7. The SiC crystalline material of claim 1, wherein the absorption coefficient is within another absorption coefficient range defined by the minimum value and the maximum value that are 0.2 cm$^{-1}$ apart over another wavelength range from 400 nm to 700 nm.

8. The SiC crystalline material of claim 1, wherein the absorption coefficient is within another absorption coefficient range defined by another minimum value and another maximum value that are 0.15 cm$^{-1}$ over another range from 400 nm to 700 nm.

9. The SiC crystalline material of claim 1, wherein the absorption coefficient is less than or equal to 0.15 cm$^{-1}$ over the wavelength range.

10. The SiC crystalline material of claim 1, wherein the SiC crystalline material comprises a thickness in a range from 2 mm to 55 mm.

11. The SiC crystalline material of claim 1, wherein the SiC crystalline material comprises a thickness in a range from 100 μm to 2 mm.

12. A silicon carbide (SiC) crystalline material comprising an absorption coefficient that is less than 0.15 reciprocal centimeters (cm$^{-1}$) over a wavelength range from 420 nanometers (nm) to 700 nm.

13. The SiC crystalline material of claim 12, wherein the absorption coefficient is in a range from greater than 0 cm$^{-1}$ to less than 0.15 cm$^{-1}$ over the wavelength range.

14. The SiC crystalline material of claim 12, wherein the absorption coefficient is less than 0.06 cm$^{-1}$ over another wavelength range from 450 nm to 680 nm.

15. The SiC crystalline material of claim 12, wherein the SiC crystalline material comprises a diameter that is greater than or equal to 145 mm.

16. The SiC crystalline material of claim 15, wherein the diameter is in a range from 145 mm to 305 mm.

17. The SiC crystalline material of claim 12, wherein the SiC crystalline material comprises one of 4H-SiC, semi-insulating SiC, n-type SiC, and p-type SiC.

18. The SiC crystalline material of claim 12, wherein the SiC crystalline material comprises a thickness in a range from 2 mm to 55 mm.

19. The SiC crystalline material of claim 12, wherein the SiC crystalline material comprises a thickness in a range from 100 μm to 2 mm.

* * * * *

UNITED STATES PATENT AND TRADEMARK OFFICE
CERTIFICATE OF CORRECTION

PATENT NO. : 12,024,794 B2
APPLICATION NO. : 17/350100
DATED : July 2, 2024
INVENTOR(S) : Robert Tyler Leonard et al.

Page 1 of 1

It is certified that error appears in the above-identified patent and that said Letters Patent is hereby corrected as shown below:

In the Claims

In Column 16, Line 9, in Claim 1: delete "0.15 centimeters (cm-1)" and insert -- 0.15 reciprocal centimeters (cm-1) -- therefor.

Signed and Sealed this
Eighteenth Day of March, 2025

Coke Morgan Stewart
*Acting Director of the United States Patent and Trademark Office*